United States Patent
Chan Wai Po et al.

(10) Patent No.: US 9,041,611 B2
(45) Date of Patent: May 26, 2015

(54) IMPEDANCE MATCHING METHOD FOR A MULTIBAND ANTENNA, AND TRANSMISSION OR RECEIVER CHANNEL HAVING AUTOMATIC MATCHING

(75) Inventors: Francis Chan Wai Po, Grenoble (FR); Emeric De Foucauld, Voiron (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 234 days.

(21) Appl. No.: 13/394,769

(22) PCT Filed: Sep. 1, 2010

(86) PCT No.: PCT/EP2010/062791
§ 371 (c)(1),
(2), (4) Date: Mar. 7, 2012

(87) PCT Pub. No.: WO2011/026858
PCT Pub. Date: Mar. 10, 2011

(65) Prior Publication Data
US 2012/0169566 A1     Jul. 5, 2012

(30) Foreign Application Priority Data

Sep. 7, 2009    (FR) ..................................... 09 56063

(51) Int. Cl.
*H01Q 9/00*      (2006.01)
*H01Q 1/50*      (2006.01)
(Continued)

(52) U.S. Cl.
CPC . *H03H 7/40* (2013.01); *H03F 1/56* (2013.01); *H03F 3/24* (2013.01); *H03F 2200/378* (2013.01); *H03F 2200/387* (2013.01)

(58) Field of Classification Search
CPC   H03F 1/56; H03F 2200/387; H03F 2200/378
USPC ......................................... 343/860; 333/17.1
See application file for complete search history.

(56) References Cited

U.S. PATENT DOCUMENTS

| 6,411,655 | B1 * | 6/2002 | Holden et al. | ................. 375/269 |
| 2007/0188168 | A1 * | 8/2007 | Stanley et al. | ................. 324/228 |

(Continued)

FOREIGN PATENT DOCUMENTS

FR          2573940 A1     5/1986

OTHER PUBLICATIONS

Chris Bowick, RF Circuit Design, 1982, Elsevier Science, pp. 68-72.*

*Primary Examiner* — Dameon E Levi
*Assistant Examiner* — Ricardo Magallanes
(74) *Attorney, Agent, or Firm* — Baker & Hostetler LLP (57) ABSTRACT

An automatic antenna impedance matching method for a radiofrequency transmission circuit. An impedance matching network is inserted between an amplifier and an antenna. The output current and voltage of the amplifier and their phase difference are measured by a variable measurement impedance, and the complex load impedance of the amplifier is deduced from this; the impedance of the antenna is calculated as a function of this complex impedance and as a function of the known current values of the impedances of the matching network. Starting from the value found for the impedance of the antenna, new values of the matching network are calculated that allow the load to be matched to the nominal impedance of the amplifier. The measurement impedance has a value controllable by the calculation processor according to the application and notably as a function of the operating frequency and of the nominal impedance of the amplifier.

13 Claims, 2 Drawing Sheets

(51) Int. Cl.
*H03H 7/38* (2006.01)
*H03F 3/00* (2006.01)
*H03F 1/00* (2006.01)
*H03H 7/40* (2006.01)
*H03F 1/56* (2006.01)
*H03F 3/24* (2006.01)

(56) References Cited

U.S. PATENT DOCUMENTS

2008/0204051 A1* 8/2008 Gundlach et al. ............. 324/682
2009/0066440 A1* 3/2009 Chan Wai Po et al. ......... 333/32

* cited by examiner

Fig. 1

IMPEDANCE MATCHING METHOD FOR A MULTIBAND ANTENNA, AND TRANSMISSION OR RECEIVER CHANNEL HAVING AUTOMATIC MATCHING

CROSS-REFERENCE TO RELATED APPLICATIONS

This application is a National Stage of International patent application PCT/EP2010/062791, filed on Sep. 1, 2010, which claims priority to foreign French patent application No. FR 09 56063, filed on Sep. 7, 2009, the disclosures of each of which are incorporated by reference in their entireties.

FIELD OF THE DISCLOSED SUBJECT MATTER

The invention relates to the design of an automatic impedance matching circuit for a radio antenna.

BACKGROUND

In some radiofrequency information transmission applications, it has been observed that the transmission or receiver antenna could have an impedance that was highly dependent on conditions external to the antenna, and notably dependent on the environment in which the antenna is placed.

For example, in medical telemetry, it may be necessary to introduce the antenna into a probe placed in the human body, and the impedance is then highly dependent on the biological environment in which the antenna is located. It depends on the electrical properties (conductivity, dielectric constant) of the surrounding tissues (muscles, fat) or of the liquid medium (blood, other liquids) into which the antenna may be immersed.

Even in more conventional applications of radiofrequency transmission (mobile telephony, etc.) the impedance of the antenna can vary.

A transmission (respectively receiver) channel comprises at least one amplifier with which one or more filters may be associated.

Generally speaking, the variations in antenna impedance are particularly sensitive for miniaturized antennas having a high quality factor, used in applications with severe size restrictions.

These variations in impedance can lead to losses known as 'mismatch losses': these losses result from the fact that the transmission channel which feeds the antenna, or the receiver channel which receives a signal from the antenna, is in general designed to have optimum performance when it is loaded (at the output for the transmission channel or at the input for the receiver channel) by a well-defined nominal impedance; it has degraded performance characteristics when it is loaded by an impedance different from its nominal value. The mismatch losses can be as high as 40 dB.

For this reason, attempts have been made to interpose between the output of the transmission channel and the transmission antenna (and it could also be done at the input for a receiver antenna) an impedance matching network, which means that the transmission channel sees an impedance different from that of the antenna and preferably equal to the nominal value for which it has been designed, for example 100 ohms or 500 ohms. The matching network is tunable, in other words its capacitive and/or inductive elements have adjustable values in order to take into account the environmental conditions of the antenna such that the matching is the best possible whatever the circumstances.

In the prior art illustrated by the U.S. Pat. No. 4,375,051, a bidirectional coupler is used to detect a mismatch: the power of the amplifier is applied to a load via the coupler and an impedance matching network; if the system is mismatched, a part of the power sent to the antenna is reflected by the latter instead of being emitted into the surrounding environment; the reflected part returns into the coupler and emerges from it via a specific output; the reflected output power is detected, measured, and is used as a feedback control to the impedance network to modify its characteristics in a direction tending to reduce the reflected power. The matching network comprises variable capacitors. The control of the network can be achieved by a feedback control loop based on hardware circuits or based on a calculation algorithm.

This process is iterative, slow, and power-consuming. The use of a coupler renders the matching circuit impossible to integrate into an integrated circuit chip due to the bulkiness of the coupler.

In the patent application US 2009-0066440, a method is furthermore provided for automatic impedance matching in a transmission or receiver channel, in which the amplitude and the phase of the current and of the voltage at the output of the transmission channel (or at the input of the receiver channel) are simultaneously detected. The ratio between the voltage and the current is representative of the load impedance Zm seen by the channel loaded by the combination of the matching network and of the antenna of impedance $Z_{ant}$. The load impedance Zm is measured and the antenna impedance $Z_{ant}$ is calculated from the measured load impedance Zm and from the impedances of the matching network whose configuration is known at the time of the measurement, and finally, the modification that needs to be applied to one or more of the impedances of the matching network is calculated, in order to obtain the result that the impedance seen by the amplifier becomes matched to the nominal impedance of the amplifier in the current environmental conditions of the antenna.

However, the circuit described in this patent application is designed to operate at a well-defined radiofrequency and it does not allow for correct operation if the operating frequency of the channel is modified.

SUMMARY

According to the invention, a transmission or receiver channel is provided that comprises automatic impedance matching means, together with an automatic impedance matching method, which can operate in several different frequency bands and which are therefore adaptable to several possible applications operating at different frequencies.

The method according to the invention is an automatic impedance matching method for a radiofrequency transmission channel comprising at least one amplifier, an antenna, a calculation processor, and an impedance matching network between the amplifier and the antenna, this network comprising several impedances some of which have adjustable numerical values, the amplifier having a nominal load impedance for which the channel has the desired performance, and the method comprising the following steps:

measurement of the output current and voltage of the amplifier, calculation of the complex impedance defined by the ratio between this voltage and this current taking into account their phase difference, this impedance representing a current load impedance of the amplifier, calculation of the impedance of the antenna as a function of this current load impedance and as a function of the known current values of the adjustable impedances of the matching network, calculation of new values for the adjustable impedances of the matching network which allow an overall load impedance of the amplifier to be obtained as close as possible to the nominal load impedance, based on the calculated value of antenna impedance, control of the matching network for adjusting the adjustable impedances to these new values.

The method is characterized in that the current is measured by means of a variable measurement impedance placed in series between the output of the amplifier and the impedance matching network, and this measurement impedance is controlled by the processor as a function of the operating frequency and of the nominal load impedance of the amplifier.

The variable measurement impedance is therefore controllable by the calculation processor, such that its value can be changed, and its value is known to the calculation processor because it is involved in the calculation of the matching network.

Also, symmetrically, for a radiofrequency receiver circuit, the invention provides an automatic impedance matching method for a radiofrequency receiver channel comprising at least one amplifier, an antenna, a calculation processor, and an impedance matching network between the antenna and the amplifier, this network comprising several impedances some of which have adjustable numerical values, the receiver channel having the desired performance when a nominal input impedance is connected to the input of the amplifier, the method comprising the following steps:

measurement of the current and voltage at the input of the amplifier, calculation of the complex impedance defined by the ratio between this voltage and this current taking into account their phase difference, this impedance representing an input impedance currently connected to the amplifier, calculation of the impedance of the antenna as a function of this current input impedance and as a function of the known current values of the adjustable impedances of the matching network, calculation of new values for the adjustable impedances of the matching network which allow an overall input impedance of the amplifier to be obtained as close as possible to the nominal input impedance, based on the calculated value of antenna impedance, control of the matching network for adjusting the adjustable impedances to these new values.

The method is characterized in that the current is measured by means of a variable measurement impedance placed in series between the impedance matching network and the amplifier, and this measurement impedance is controlled by the processor as a function of the operating frequency and of the nominal input impedance of the amplifier.

For a radiofrequency circuit simultaneously operating in transmission and in receiver mode with a single transmission-reception antenna and therefore having a transmission amplifier and a receiver amplifier, two separate matching networks can be provided, one for matching the load at the output of the transmission amplifier, the other for matching the load at the input of the receiver amplifier.

The measurement impedance can be a simple capacitor.

According to the invention, a method of calculation particularly advantageous for calculating new values of adjustable impedances of the matching network is preferably used. This method can be summarized in the following manner: the matching network is a Pi network comprising an input reactive impedance, a link reactive impedance, and an output reactive impedance; the calculation of the elements of this matching network comprises, successively a calculation of a real part $y2r$ and an imaginary part $y2i$ of an admittance $y2$ which is the inverse of the impedance ($Z_{ant}$) of the antenna, a calculation of a real part $y1r$ and an imaginary part $y1i$ of an admittance $y1$ which is the inverse of the impedance of the series assembly of the output impedance of the amplifier and the measurement impedance, the calculation of an equivalent network comprising a Pi configuration of an input reactive impedance, an output reactive impedance, and a link reactive impedance equal to that of the real network, this Pi configuration being placed between two real admittances which are the real parts $y1r$ and $y2r$, and the calculation being a determination of the input and output reactive admittances that are needed in the equivalent network for matching the impedance of this network loaded by $y2r$ to the real input impedance $y1r$, and lastly, after calculation of the input and output reactive admittances of the equivalent network, a determination of admittances of the matching network in the following manner:

the input reactive admittance of the matching network is the difference between the input admittance of the equivalent network and the imaginary part $y1i$, the output reactive impedance is the difference between the output admittance of the equivalent network and the imaginary part $y2i$, the link reactive impedance is that of the equivalent network.

The invention also relates to a radiofrequency transmission or receiver channel comprising at least one amplifier, an antenna, a calculation processor, and an impedance matching network between the amplifier and the antenna, this network comprising several impedances some of which have adjustable numerical values, the channel comprising:

a measurement impedance inserted in series between the amplifier and the matching network, means of measurement of a first voltage which is the voltage across the terminals of the measurement impedance and of a second voltage which is the voltage at the output of the amplifier (for a transmission channel) or the voltage at the input of the amplifier (for a receiver channel), first means for programming the calculation processor for calculating the current complex load or input impedance of the amplifier using the ratio between the second voltage and the first voltage, taking into account the phase difference between these voltages, second means for programming the calculation processor for calculating the impedance of the antenna as a function of this current load or input impedance and as a function of the known current values of the adjustable impedances of the matching network, third means for programming the calculation processor for calculating new adjustable values of impedance for the matching network which allow an overall load or input impedance of the amplifier to be obtained as close as possible to a nominal load or input impedance of the amplifier, based on the calculated value of antenna impedance, electrical means for controlling the matching network for adjusting the adjustable impedances to these new values.

The channel is characterized in that the measurement impedance is a variable complex impedance, the calculation processor comprises means for selecting a desired value for the measurement impedance as a function of the desired operating frequency and of the value of the nominal load or input impedance of the channel, and the channel comprises means for assigning this selected value to the measurement impedance.

The matching network can be composed of a single T or Pi configuration of three reactive impedances, for example one capacitor and two inductors, or better, one inductor and two capacitors. At least one of these impedances is variable but, in practice, two impedances will be variable. Preferably, two variable capacitors and a fixed inductor will be used considering that it is easier to fabricate accurate variable capacitors than variable inductors. The matching network may also have several cascaded stages if there is a risk of being particularly high mismatching. In this case, each stage can be composed of a single T or Pi configuration of three reactive impedances with, in principle, two variable reactive impedances in each stage.

The variable impedances, measurement impedance or impedances of the matching network may be fabricated in the form of several elementary impedances in series and/or in parallel, individually switchable by an electronic control. A variable capacitor can also take the form of an element controllable by an electrical voltage (a varactor diode, for example).

The value given to the measurement impedance by the calculation processor is preferably the impedance of a capacitor of value C in the range between 1 times and 4 times the ratio $1/Z_{opt}\omega$, where $Z_{opt}$ is the nominal impedance of the channel, and $\omega$ is $2\pi f$, $f$ being the desired operating frequency for the channel. A preferred value is $C=2/Z_{opt}\omega$. If the measurement impedance can vary according to discrete values, the value of capacitance closest to this optimum value will be chosen. This is the case, for example, if the variable capacitance is formed from a group of several switchable capacitors connected in parallel.

The aim of the invention is ideally to obtain an overall load or input impedance of the amplifier equal to the nominal input or load impedance of the amplifier, but the adjustment precision of the adjustable elements of the matching network is not infinite and a solution will therefore be sought that, in practice, comes as close as possible to this nominal impedance.

BRIEF DESCRIPTION OF THE DRAWINGS

Other features and advantages of the invention will become apparent upon reading the detailed description that follows and which is presented with reference to the appended drawings, in which.

DETAILED DESCRIPTION

In the detailed description that follows, it will systematically be considered that the antenna is a transmission antenna fed by the output of an amplifier which is designed to operate in an optimal manner when the load placed at its output has a nominal impedance $Z_{opt}$ and when the frequency of operation is f, corresponding to an angular frequency $\omega=2\pi\cdot f$. At high frequency, the impedance $Z_{opt}$ will generally be complex. However, the invention is applicable in the same way if the antenna is a reception antenna connected to the input of an amplifier designed for operating in an optimal manner when the impedance connected to its input is a nominal impedance $Z_{opt}$ and when the frequency of operation is f. If the antenna has to operate in both transmission and in reception mode, the transmission amplifier will preferably have a nominal load impedance equal to the nominal input impedance of the receiver amplifier. If this is not the case, the transmission amplifier and the receiver amplifier will be associated with two separate matching networks, one for matching the output load of the transmission amplifier, the other for matching the input load of the receiver amplifier. Since the method is the same for the transmission and the receiver and the calculations are also the same, the invention will only be described in relation to the transmission amplifier and antenna.

Figure 1:
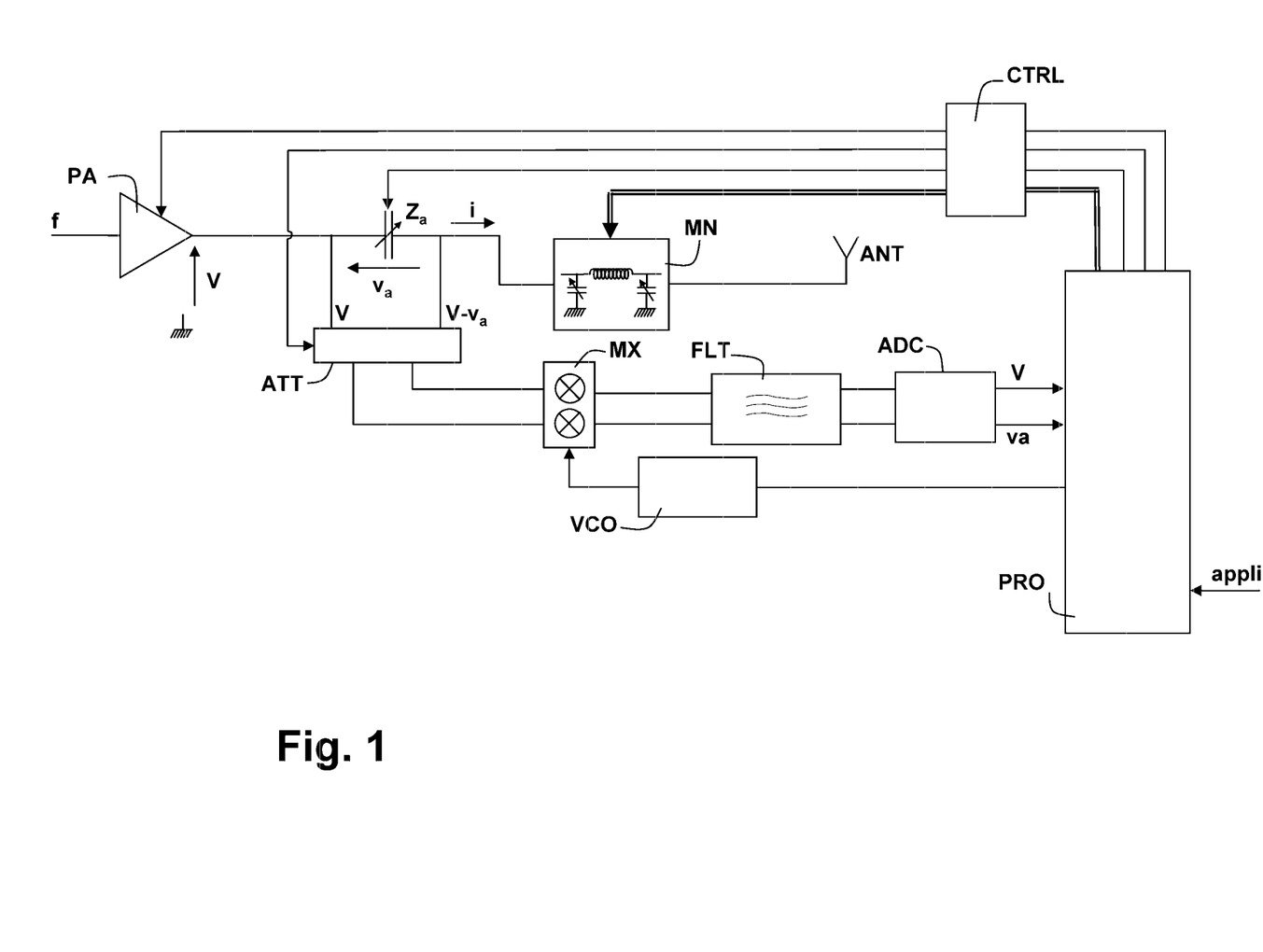
FIG. 1 shows the general make-up of a radiofrequency transmission circuit comprising automatic impedance matching means according to the invention.

FIG. 1 shows a schematic circuit diagram of the radiofrequency transmission circuit according to the invention, with an amplifier PA operating at the transmission carrier frequency f, an antenna ANT fed by the amplifier, a matching network MN inserted in series between the output of the amplifier PA and the antenna ANT. This circuit diagram could also include a filter between the amplifier PA and the network MN and/or a filter between the network MN and the antenna.

A measurement impedance Za, of variable value, is inserted between the output of the amplifier and the impedance matching network MN. The impedance $Z_a$ is used for the measurement of the current i which is output from the amplifier. The impedance $Z_a$ is preferably a single capacitor of value $C_a$ and of impedance $Z_a=1/j\cdot C_a\cdot\omega$. The voltage at its terminals is a voltage $v_a$ equal to $Z_a\cdot i$, or $v_a=i/j\cdot C_a\cdot\omega$. The output voltage of the amplifier, which feeds the network MN and the antenna ANT, is a voltage V. The impedance seen by the output of the amplifier is therefore an impedance Z equal to V/i. If V and i are measured in both amplitude and phase, a current measured value, Zm, of the impedance Z seen by the amplifier can be determined. The value Zm is a complex value, with a real part and an imaginary part, when it is desired to take the phase difference between the current i and the voltage V into account. The current i is determined by the measurement of $v_a$, with $Z_a$ known.

The measurement of the voltage V and the measurement of the voltage $v_a$ are preferably made after conversion of the frequency f to a lower intermediate frequency, or into baseband. This allows the precision of the calculation to be improved and, in the general case, circuit elements (mixer, local oscillators) which are in any case present in the transmission or receiver channel can be used.

The voltages V and $v_a$ are preferably attenuated by a variable attenuator ATT that brings these voltages down to a level which places them within the range of linear operation of the mixers MX that are used to convert the frequency f to an intermediate frequency.

The mixers MX receive the voltages V and $v_a$ (or V and V-$v_a$, which amounts to the same thing) together with a local frequency used to carry out the conversion to an intermediate frequency. The local frequency is supplied by an oscillator VCO controlled by a voltage or a phase-locked loop comprising a voltage-controlled oscillator; the value of the local frequency depends on both the operating frequency and on the intermediate frequency to which the operating frequency is to be down-shifted in order to effect the measurement of V and $v_a$.

The mixers can be followed by filters FLT designed to eliminate the undesirable frequencies at the output of the mixers. The output voltages of these filters are converted into digital signals by analog-digital converters (ADC) which supply values representing the voltages V (output voltage of the amplifier) and $v_a$ (voltage measured across the terminals of the variable impedance $Z_a$).

A processor PRO (dedicated processor or programmed microprocessor) receives the digital values thus measured. This processor comprises the calculation means (programs) enabling the operation of the circuit, and notably allowing:

the calculation of a desired value for the impedance $Z_a$ (or, in practice, a value of capacitance $C_a$) depending on the application; this calculation relies notably on the knowledge of the frequency used by the application and also of the optimum load impedance (in the case of a transmission channel) or optimum input impedance (in the case of a receiver channel) for the amplifier;

the calculation of the impedance values that need to be assigned to the elements of the impedance matching network MN; this calculation relies on the measurements of V and $v_a$ supplied by the analog-digital converters and on the value of the impedance $Z_a$ imposed by the previous calculation; it involves a calculation of the modulus and argument, or the real part and imaginary part, of the measured impedance Zm at the output of the amplifier (or at the input).

The processor PRO controls a control circuit CTRL which allows the value determined by the processor to be imposed on the capacitance $C_a$ (or more generally on the measurement impedance $Z_a$) and the values of impedance determined by the processor to be imposed on the network MN.

In order to be able to perform calculations that take into account the nature of the application (value of operating frequency, optimum impedance), the processor comprises for example an input (input denoted by "appli" in FIG. 1) receiving information on the application. This input can for example be a multiple input on which are input various data values relating to the application, or a single input only receiving an identification of the application, the frequency and optimum impedance data then being contained in a table internal to the processor; the identification of the application being used to access the information in the table.

Preferably, the processor also comprises means for determining a value of attenuation and the control circuit CTRL sends a command to the attenuator ATT for it to establish this attenuation. The calculation of the desired attenuation relies on the value of the nominal power of the amplifier; this depends on the application and, if the circuit must be able to work for several different applications at different powers, the processor must receive information on the nominal power desired in the application. This information on power of the amplifier is input, like the information on frequency and on optimum impedance, via the input "appli", or else it is contained in the table internal to the processor. The aim of the attenuation is avoid applying too high a power to the mixers, which would potentially drive them out of their linearity range.

Figure 2:
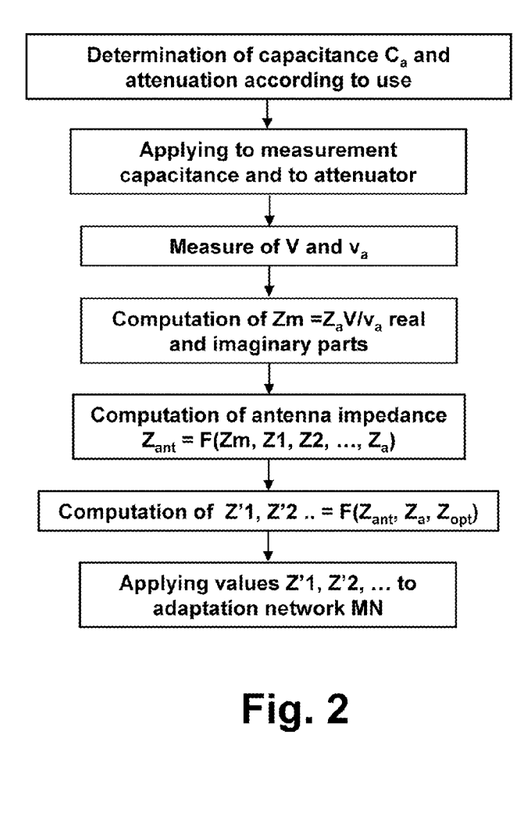
FIG. 2 shows a flow diagram of the main steps of the method according to the invention.

The method according to the invention is summarized in the flow diagram in FIG. 2 and comprises the following main steps:

calculation of the value needed to be given to the impedance $Z_a$ (for example calculation of the value of a capacitance $C_a$, depending on the application); this calculation can consists in a simple selection of a value in a table whose address is determined by the application; the calculation can also be a calculation by means of a formula, which will be considered again hereinbelow; $Z_a = F1(\text{"appli"})$ where F1 is a first calculation function defined by means for programming the processor PRO;

assignment of the value thus calculated to the impedance $Z_a$, for example selection of one or more capacitors within a group of switchable capacitors, or adjustment of a voltage of a varactor diode;

calculation and assignment of a value of attenuation att, in the case where the channel operates at a variable nominal power depending on the application; $att = F2(\text{"appli"})$ where F2 is a function defined by the means for programming the processor;

calculation by the processor of the modulus and of the argument of the impedance Zm of the current load of the amplifier; $Zm = Z_a \cdot V/v_a$; it should be noted V could be measured upstream of the capacitance $C_a$ rather than downstream; the impedance Zm would then be the upstream impedance and the later calculations must take this into account considering that the impedance $Z_a$ forms a part of the measurement output impedance of the amplifier rather than of the load of the amplifier;

calculation from the above of the vector impedance Zm of real and imaginary parts, calculation of the impedance of the antenna $Z_{ant}$, using these values and the known current values of impedances of the various impedances Z1, Z2, etc. forming the matching network MN; $Z_{ant} = F3(Zm, Z1, Z2, \ldots Z_a)$, calculation of one or more values of modified impedances Z'1, Z'2 of the matching network MN based on a desired value $Z_{opt}$ of the load impedance of the amplifier, on the measurement impedance $Z_a$, and on the calculated antenna impedance $Z_{ant}$, and issue of a command for the network MN to give to the impedances Z1, Z2 of this network the modified values Z'1, Z'2 thus calculated; $Z'1, Z'2 \ldots = F4(Z_{ant}, Z_a, Z_{opt})$, issue of a command to the channel from the control circuit CTRL to give to the impedances Z1, Z2 of this network the modified values Z'1, Z'2 thus calculated.

Calculation and Choice of the Measurement Impedance $Z_a$

The basis of this calculation relies on the following considerations:

a) reducing the efficiency of the matching network MN too much must be avoided, this efficiency decreasing as the impedance $Z_a$ increases; a sufficiently high capacitance $C_a$ is therefore required;

b) however, too high a capacitance has a large size, it is a source of losses, and it does not allow the ratio $V/v_a$ to be correctly measured ($v_a$ being too small) which is needed for the matching calculations; conversely, on the other hand, too low a capacitance would mean that the variations in load impedance due to the variations in antenna impedance would only lead to small changes in the ratio $V/v_a$ even if $v_a$ is easier to measure, and the end result would also be a difficulty in the calculation of the matching network.

From the point of view of the measurement to which the preceding paragraph b) refers, the general thinking is that the best value of the measurement impedance will be such that its modulus is close to the optimum load impedance of the amplifier and, if anything, smaller than the latter. Moreover, from the point of view of the efficiency of the network, it is better to decrease this value slightly in order to slightly increase the efficiency.

Consequently, according to the invention, a preferred value of the modulus of the measurement impedance, considered as purely capacitive, is in the range between $R_{opt}$ and $R_{opt}/4$ where $R_{opt}$ is the modulus of the load or of the optimum input impedance $Z_{opt}$. The capacitance $C_a$ resulting from this is preferably in the range between $1/\omega R_{opt}$ and $4/\omega R_{opt}$, $\omega$ is the angular frequency $2\pi f$ of the operating frequency. A preferred value is $C_a=2/\omega R_{opt}$.

Depending on the frequency and on the nominal load impedance fixed by the application, calculation by the processor can be included of an optimum value of capacitance given by a formula such that $C_a=k/\omega \cdot R_{opt}$, k being a fixed number in the range between 1 and 4; however, the selection by the processor may also be included, as a function of the frequency and of the nominal load impedance, of a value from within a table of predefined values, calculated with the formulae hereinabove. The control circuit CTRL applies this value to the capacitor $C_a$.

Returning now to the reasons for the choice of a preferred value for the measurement capacitor $C_a$, the following argument may be proffered:

The quality factor Q of a matching network, assumed to be placed between, on one side, a source resistance $R_S$ (real part of the impedance of the amplifier) and, on the other, a load impedance $R_{LD}$, is $Q=[(R_S/R_{LD})-1]^{1/2}$ when the network is matched. This quality factor is proportional to the frequency and to the ratio between the mean energy stored in the network and the mean losses in the network.

However, if the source resistance $R_S$ is in series with a reactive impedance $X_S$, this series circuit must be transformed into a parallel circuit of a resistance $R_{PS}$ and a capacitance $C_{PS}$, in order to be able to apply the formula hereinabove, the resistance $R_{PS}$ being substituted for the resistance $R_S$: $Q=[(R_{PS}/R_{LD})-1]^{1/2}$. However, since the two representations, series and parallel, correspond to the same quality factor for the complex impedance, the quality factor being the ratio between the imaginary part and the real part of the complex impedance, it can be shown that:

the quality factor is $Q_s=X_S/R_S$ or $Q_{PS}=R_{PS}/X_{PS}$ $R_{PS}=R_S(1+R_{PS}^2/X_{PS}^2)$ by reason of the equations for transformations of series impedances into parallel impedances $X_{PS}=X_S(1+X_{PS}^2/R_{PS}^2)$ for the same reason hence, $R_{PS}=R_S(1+Q_S^2)=R_S[1+1/(R_S C_a \omega)^2]$ in the case of a capacitance $C_a$ in series with $R_S$ upstream of the network MN.

The quality factor Q of the matching network, defined by $Q=[(R_{PS}/R_{LD})-1]^{1/2}$, then becomes $$Q = \sqrt{\frac{R_S * \left(1 + \frac{1}{(R_S C_a \omega)^2}\right)}{R_{LD}} - 1}$$

The efficiency of the matching network (power transmitted over power lost) depends on this quality factor Q together with the individual quality factors of the elements forming the network. If the network is a simple Π configuration of two capacitors having individual quality factors $Q_C$ (imaginary part/real part of the admittance) and an inductor having a quality factor $Q_L$, the efficiency η of the network can be written;

$$\eta = \frac{1 - \frac{2Q}{Q_C}}{1 + \frac{Q}{Q_L}}$$

If it is considered that the quality factor of the capacitors is very high, this amounts to writing that $$\eta = \frac{1}{1 + \frac{Q}{Q_L}}$$

The efficiency for a given value of $Q_L$ (mainly fixed by the technology for fabrication of the inductance) therefore depends on Q; it increases when Q decreases, hence when the capacitance $C_a$ increases. A curve of variation in the efficiency as a function of the capacitance $C_a$ may be traced for a given frequency, a given value of source resistance $R_S$, a value of load resistance $R_{LD}$ and a value of inductor quality factor. The efficiency may also be calculated in the presence of an infinite capacitance $C_a$, in other words when the amplifier is directly connected to the network, this efficiency being higher the higher the quality factor of the inductor. It can then be imposed that the efficiency in the presence of a capacitor $C_a$ be at least 98% of the efficiency in the absence of a measurement capacitor. This fixes a minimum value for the capacitance $C_a$.

However, this minimum value must remain compatible with what has been said hereinabove, namely that the capacitance $C_a$ preferably has a value equal to $k/\omega \cdot R_{opt}$, where k is preferably in the range between 1 and 4.

If the quality factor $Q_L$ of the inductor is low, the efficiency η of the network will be low and it will then certainly be necessary to choose k from the highest values (between 2 and 4). If the quality factor of the inductor is better, a lower coefficient k could be chosen, between 1 and 2 (in order to have a good measurement efficiency in terms of value, neither too low nor too high, of the ratio $V/v_a$ as previously explained) while at the same time having an efficiency of at least 98% of the efficiency in the absence of a capacitor.

By way of example:

The load or optimum input impedances $R_{opt}$ are typically 50 ohms, 100 ohms, or 200 ohms depending on the applications. The operating frequencies are typically 403 MHz, 900 MHz, 2.44 GHz depending on the applications. It is easy to calculate a measurement capacitance, by assuming that the coefficient is k=2. For example:

C=15.8 pF for 403 MHz at 50 ohms
C=1.77 pF for 900 MHz at 200 ohms
C=1.30 pF for 2.44 GHz at 100 ohms.

If the capacitance is different from this value, it goes without saying that the circuit still works. Typically, possible values of the capacitance might be from 1 to 16 pF (obtained by the switchable parallel connection of four capacitors with respective values 1, 2, 4, and 8 pF) and in this case, in the three previous examples, values of $C_a$ that are simply 16 pF, 2 pF, and 1 pF, respectively, would be chosen. The processor subsequently calculates the matching of the network MN using the selected values 16 pF, 2 pF, and 1 pF, respectively, rather than the optimum theoretical values 15.8 pF, 1.77 pF and 1.30 pF.

Matching Calculation for the Network MN

Figure 3:
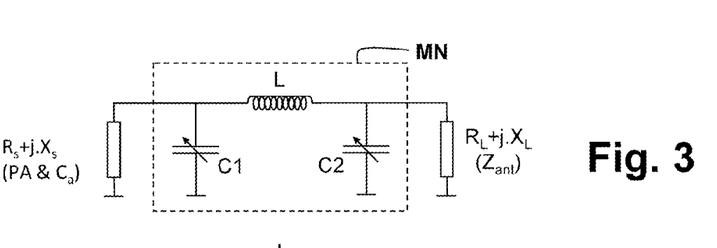
FIG. 3 shows one example of an impedance matching network, in a single Pi configuration, with two variable capacitors.

The calculation of course depends on the configuration of the matching network MN and, hereinafter, one example will be presented of a Pi configuration of the matching network with three impedances Z1, Z2, Z3 consisting of two parallel connected variable capacitors C1 and C2 separated by an inductor L in series, of fixed value; this network is shown in FIG. 3.

The current values of the capacitors of the matching network will be called C1 and C2, and the new values of these capacitors C1' and C2', calculated for optimizing the load impedance of the amplifier by making it, as far as possible, equal to the optimum value $Z_{opt}$.

First Step: Calculation of the Current Load Impedance

The voltage levels V and $v_a$ down-shifted to the intermediate frequency or into baseband are used for calculating the vector current i then the complex impedance V/i seen by the amplifier (or for calculating this impedance V/i directly without going via the determination of i). The phase differences are conserved in the change of frequency. It is recalled that V could be measured across the input terminals of the network downstream of the capacitance $C_a$, as long as it is taken into account in the calculations.

The modulus of i is the ratio of the modulus of $v_a$ and the modulus of the impedance $Z_a = 1/j \cdot C_a \cdot \omega$; or alternatively, the modulus of the impedance Z is the modulus of the product $V \cdot Z_a / V_a$, in other words of the product $V/j \cdot C_a \cdot \omega \cdot v_a$. The phase difference of i with respect to the voltage V is an angle $\theta$ which represents the argument of the impedance Z. This angle can be determined from the phase difference between V and $v_a$ from which $\pi/2$ is subtracted given that the phase difference between i and $v_a$ is $\pi/2$ since $Z_a$ is a capacitance.

The phase difference between V and $v_a$ can be calculated for example by multiplying the analog signals V and $v_a$, down-shifted into baseband, and by observing the periodic variation of the product of the two signals. This product oscillates between a positive maximum value and a negative minimum value. The algebraic sum of these two values is proportional to the cosine of the phase difference and the coefficient of proportionality is the algebraic difference of these two values. Consequently, by taking the ratio between the sum of the two values and the difference of the two values, the cosine of the phase difference is obtained from which the phase difference between V and $v_a$ is extracted, and consequently the phase difference between V and i. Other methods for digital calculation of the phase difference may be used, for example by digitization of the two signals V and $v_a$ over one bit, equal to 1 when the signal is positive and to 0 when it is negative. The temporal shift of the trains of pulses of bits 1 resulting from the digitization of V, with respect to the same trains of pulses corresponding to the digitization of $v_a$, represents the phase difference between V and $v_a$. The sign of the phase difference is identified by observing the rising edges of the signals thus digitized over one bit; this can be carried out using a flip-flop D that receives on a signal input one of the voltages V or $v_a$ and on a clock input the other of these voltages, and which generates at its output the state of the signal input at the moment of a rising edge on the clock input.

Once the argument $\theta$ of the impedance Z has been obtained, the real part and the imaginary part of Z can be calculated. The impedance thus measured for Z will be called Zm; Zmr is its real part, Zmi is its imaginary part.

Zmr is equal to the modulus of Z multiplied by cos $\theta$.
Zmi is equal to the modulus of Z multiplied by sin $\theta$.

Second Step: Calculation of the Current Impedance of the Antenna

Starting from this measurement of Z, knowing the configuration of the matching network, which is that in FIG. 3, with the known current numerical values of the capacitors C1 and C2 and of the inductor L, and also the numerical value of the capacitor $C_a$, the impedance of the antenna can be calculated.

All the details of the calculation will not be presented here, but only the main steps.

If the impedance $Z_{ant}$ of the antenna is written in the form $Z_{ant} = (A + jB)/(C + jD)$, it may be shown that, in the circuit diagram in FIG. 3:

$A = 1 - LC1\omega^2 - LC_a\omega^2 - Zmi \cdot LC1C_a\omega^3 + Zmi \cdot C_a\omega$.
$B = Zmr \cdot LC1C_a\omega^3 - Zmr \cdot C_a\omega$.
$C = Zmr \cdot LC1C2C_a\omega^4 - Zmr \cdot C1C_a\omega^2 - Zmr \cdot C2C_a\omega^4$.
$D = Zmi \cdot (LC1C2C_a\omega^4 - C1C_a\omega^2 - C2C_a\omega^2) + L\omega^3(C1C2 + C2C_a) - C1\omega - C2\omega - C_a\omega$.

The modulus and the argument of the current antenna impedance $Z_{ant}$ are deduced from this:

the modulus of $Z_{ant}$ is the square root of $(A^2 + B^2)/(C^2 + D^2)$.
the argument of $Z_{ant}$ is the difference between the arctangent of B/A and the arctangent of D/C.

The real part of $Z_{ant}$ is ZantR, equal to the modulus multiplied by the cosine of this argument; the imaginary part of $Z_{ant}$ is Zantim and is the modulus multiplied by the sine of this same argument.

In the same way, the real part YantR and the imaginary part Yantim of the admittance $Y_{ant}$ of the antenna may also be calculated.

$Z_{ant}$ and $Y_{ant}$ may be completely determined after the calculation of Zm.

Third Step: Calculation of Modified Values for the Network MN

Knowing both the current impedance of the antenna and all the impedances of the matching network (C1, C2, L), together with the capacitance $C_a$, the values C'1, C'2, that must be given to the capacitors C1 and C2 for the impedance of the whole assembly, such as will be seen across the terminals of the amplifier, are equal to the nominal value $Z_{opt}$ and no longer to the value Zm that was previously determined. Since perfect equality is not possible, the aim is to come as close as possible to it, taking into account notably the fact that the precision of adjustment of the capacitors of the matching network is limited.

The method is inspired by the principles used for calculating impedances with the Smith chart: the capacitive or inductive values of impedance, connected in parallel or in series, are sought which move the load impedance over the chart until it is brought to the center of the chart, the center representing a nominal impedance. Since the graduations of these charts are normalized, with a nominal unit impedance at the center of the chart, rather than the real values of impedances, their normalized values are each time considered, in other words the real values divided by $Z_{opt}$. At the end of the calculations, to recover the true impedances they are multiplied by $Z_{opt}$.

The calculation based on the normalized values proceeds in several phases, and a particularly advantageous way of performing this calculation is given hereinafter. It will be noted that the method of calculating matching of the elements of a network which will now be presented could be used in any given context where impedance matching is required knowing the complex impedance downstream of the network and the complex impedance upstream.

The calculation principle will only be presented for a transmission channel (matching network placed downstream of the amplifier), the transposition being trivial for a receiver channel (network placed upstream of the amplifier).

It will firstly be considered that a normalized series complex source impedance $R_s + jX_s$ (comprising both the output impedance of the amplifier and the measurement capacitor $C_a$) is placed upstream of the network, and that a series complex load impedance $R_L + jX_L$ (the normalized impedance of the antenna $Z_{ant}$ that was previously calculated) is placed downstream (circuit diagram in FIG. 3).

This circuit diagram is transformed into an equivalent circuit diagram in which the upstream and downstream impedances are transformed into parallel admittance configurations $1/R_{PS}$ and $jC_{PS}$ on the source side, and $1/R_{PL}$ and $jC_{PL}$ on the load side. The circuit diagram is that in FIG. 4.

The equations which allow this transformation are known and have been discussed hereinabove. If $Q_S$ and $Q_L$ are the quality factors of the upstream and downstream complex impedances, then $Q_S = -X_S/R_S$ and $Q_L = -X_L/R_L$, and the series-parallel transformation equations give:

$$R_{PS} = R_S(1+Q_S^2) \text{ and } C_{PS} = Q_S/R_{PS}\omega$$

$R_{PS}$ and $C_{PS}$ can be calculated since the upstream impedances are known.

In the same way, the transformation equations may be written as $$R_{PL} = R_L(1+Q_L^2) \text{ and } C_{PL} = Q_L/R_{PL}\omega$$

Figure 4:
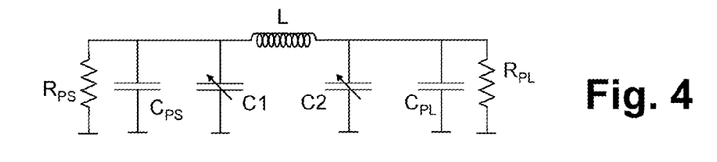
FIG. 4 and FIG. 5 show the transformations of the matching network for a simpler calculation of the matching.

The capacitance $C_{PS}$ is in parallel with the capacitor C1 of the matching network, and the capacitance $C_{PL}$ is in parallel with the capacitor C2.

Figure 5:
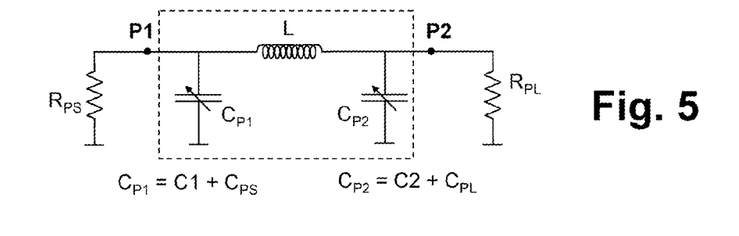

The problem of the calculation of the capacitors C1 and C2 for matching the network in the presence of source and load complex impedances is transformed into a simpler problem of calculation of a matching network placed between two real impedances $R_{PS}$ and $R_{PL}$ if a H network is now considered modified with two capacitors $C_{P1}$ and $C_{P2}$ and an inductor L, where $C_{P1} = C_{PS}+$C1, and $C_{P2}=C_{PL}+$C2 (circuit diagram in FIG. 5).

The calculation of the matching then consists in first of all seeking the new values to be given to $C_{P1}$ and $C_{P2}$ for matching the load impedance to the source impedance, then in deducing the values C'1 and C'2 to be substituted for C1 and C2.

The calculation principle is based on the analysis of impedances with Smith charts: by looking for which successions of admittances added in parallel or impedances added in series allow the transition from a source real impedance $R_{PS}$ at the point P1 upstream of the network to a load real impedance $R_{PL}$ at the point P2 downstream.

In the normalized calculation, $R_{PS}=1$. If the admittance of the capacitance $C_{P1}$ is added at the point P1 of input to the network, and this admittance is called x, x being an unknown since $C_{P1}$ is sought and x is equal to $jC_{P1}\omega$, the admittance at this point P1 is $y1(x)=1-j\cdot x$. The real part is $y1r(x)=1$; the imaginary part is $jy1i(x)=-jx$ If it is now desired to add the inductance in order to deduce from this the modification of impedance that it causes at the point P2, it is necessary to work in impedances rather than in inductances because the inductance is in series: $-j1\omega$ must be added to the impedance $z1(x)=1/y1(x)$. An impedance $z2(x)=[1/(1-j\cdot x)]-j1\omega$ is obtained at the point P2. Any potential resistive component of the inductance is assumed to be negligible, but a more complete calculation could take this into account.

This impedance $z2(x)$ can be converted into an admittance $y2(x)=1/z2(x)=1/\{[1/(1-j-x)]-j1\omega\}$ The matching of the circuit is achieved as long as this calculated admittance $y2(x)$ is equal to the admittance really connected, namely the assembly in parallel of $C_{P2}$ and the resistance $R_{PL}$.

The real part $y2r(x)$ of the admittance $y2(x)$ must be equal to the real part of the admittance really connected, namely $1/R_{PL}$.

Similarly, the imaginary part $y2i(x)$ of the admittance $y2(x)$ must be equal to $jC_{P2}\omega$.

The equality of the real parts leads to the equation $(1-L\times \omega)^2+L^2\omega^2=R_{PL}$, an equation of the second order in x which admits two solutions only one of which is viable in practice. The solution is $x_0=\{1+[R_{PL}-(L\omega)^2]^{1/2}\}/L\omega$ From this, the value of $C_{P1}$ is deduced: $C_{P1}=1/x_0\omega$ In the same way, now with $x=x_0$, by setting the equality of the imaginary parts of the admittances $y2(x_0)=1/\{[1/(1-j\cdot x_0)]-jL\omega\}$ and $jC_{P2}\omega$, $C_{P2}$ can be calculated.

Knowing $C_{P1}$ and $C_{P2}$, the inverse equations are used to work back to C1 and C2. The new values C'1 and C'2 to be given to the capacitors of the matching network are:

$$C'1 = C_{P1}-Q_S/R_{PS}\omega$$

$$C'2 = C_{P2}-Q_L/R_{PL}\omega$$

These are then the normalized values of C'1 and C'2. They must be divided by the modulus of the optimum load impedance $Z_{opt}$ in order to obtain the real values.

The processor performs all the preceding calculations and sends instructions to the control circuit CTRL to assign the values thus calculated to the capacitors of the network.

It will be understood that similar calculations can be made on the same principle with a matching network that might be different from the network C1, C2, L in FIG. 2, and also with a current measurement impedance that might be different from the capacitance $C_a$.

The invention claimed is:

1. An automatic impedance matching method for a radiofrequency transmission channel comprising at least one amplifier, an antenna, a calculation processor, and an impedance matching network between the amplifier and the antenna, the impedance matching network comprising several impedances some of which have adjustable numerical values, the amplifier having a nominal load impedance for which the channel has the desired performance, the method comprising the following steps:

measurement of an output current and an output voltage of the amplifier;

calculation of a complex impedance defined by the ratio between the voltage and the current taking into account their phase difference, the complex impedance representing a current load impedance of the amplifier;

calculation of an impedance of the antenna as a function of the current load impedance and as a function of known current values of the adjustable impedances of the impedance matching network;

calculation of new values for the adjustable impedances of the matching network which allow an overall load impedance of the amplifier to be obtained as close as possible to the nominal load impedance, based on the calculated impedance of the antenna; and control of the impedance matching network for adjusting the adjustable impedances to the new values, wherein the output current is measured by means of a measurement impedance which is an adjustable impedance placed in series between an output of the amplifier and the impedance matching network, and adjustment of this measurement impedance is controlled by the processor as a function of a desired operating frequency for the channel and of the nominal load impedance of the amplifier.

2. An automatic impedance matching method for a radiofrequency receiver channel comprising at least one amplifier, an antenna, a calculation processor, and an impedance matching network between the antenna and the amplifier, this impedance matching network comprising several impedances some of which have adjustable numerical values, the receiver channel having the desired performance when a nominal input impedance is connected to the input of the amplifier, the method comprising the following steps:

measurement of an input current and an input voltage of the amplifier;

calculation of a complex impedance defined by the ratio between the voltage and the current taking into account their phase difference, the complex impedance representing an input impedance currently connected to the amplifier;

calculation of an impedance of the antenna as a function of the current input impedance and as a function of known current values of the adjustable impedances of the impedance matching network;

calculation of new values for the adjustable impedances of the matching network which allow an overall input impedance of the amplifier to be obtained as dose as possible to the nominal input impedance, based on the calculated impedance of the antenna; and control of the impedance matching network for adjusting the adjustable impedances to the new values, wherein the input current is measured by means of a measurement impedance which is an adjustable impedance placed in series between the impedance matching network and the amplifier, and adjustment of this measurement impedance is controlled by the processor as a function of a desired operating frequency for the channel and of the nominal input impedance of the amplifier.

3. The automatic impedance matching method according to claim 1, wherein the measurement impedance is a capacitor.

4. The automatic impedance matching method according to claim 1, further comprising generation of an electrical control voltage for controlling the adjustment of the measurement impedance as a function of the calculated value.

5. The automatic impedance matching method according to claim 1, further comprising generation of switching control signals based on a result of the calculation of a new adjustable value of impedance; and application of the switching control signals to a network of switchable elementary capacitors constituting the measurement impedance.

6. The automatic impedance matching method according to claim 1, wherein the processor calculates a value which is included in the range between 1 time and 4 times a ratio $1/Z_{opt}\omega$, where $Z_{opt}$ is the nominal impedance of the channel, and $\omega$ is $2\pi f$, f being the desired operating frequency for the channel.

7. The automatic impedance matching method according to claim 1, wherein the matching network is a Pi network comprising an input reactive impedance, a link reactive impedance, and an output reactive impedance; and the calculation of the elements of this matching network comprises:

a calculation of a real part $y2r$ and an imaginary part $y2i$ of an admittance $y2$ which is the inverse of the impedance of the antenna, a calculation of a real part $y1r$ and an imaginary part $y1i$ of an admittance $y1$ which is the inverse of the impedance of the series assembly of the output impedance of the amplifier and the measurement impedance, a calculation of an equivalent network comprising a Pi configuration of an input reactive impedance, an output reactive impedance, and a link reactive impedance equal to that of the real network, this Pi configuration being placed between two real admittances which are the real parts $y1r$ and $y2r$, and the calculation being a determination of the input and output reactive admittances that are needed in the equivalent network in order to match the impedance of this network loaded by $y2r$ to the real input impedance $y1r$, and finally, after calculation of the input and output reactive admittances of the equivalent network, a determination of admittances of the matching network in the following manner:

the input reactive admittance is the difference between the input admittance of the equivalent network and the imaginary part $y1i$, the output reactive impedance is the difference between the output admittance of the equivalent network and the imaginary part $y2i$, and the link reactive impedance is that of the equivalent network.

8. The automatic impedance matching method according to claim 2, wherein the measurement impedance is a capacitor.

9. The automatic impedance matching method according to claim 2, wherein the processor calculates a value which is included in the range between 1 time and 4 times a ratio $1/Z_{opt}\omega$, where $Z_{opt}$ is the nominal impedance of the channel, and $\omega$ is $2\pi f$, f being the desired operating frequency for the channel.

10. The automatic impedance matching method according to claim 2, wherein the matching network is a Pi network comprising an input reactive impedance, a link reactive impedance, and an output reactive impedance; and the calculation of the elements of this matching network comprises:

a calculation of a real part $y2r$ and an imaginary part $y2i$ of an admittance $y2$ which is the inverse of the impedance of the antenna, a calculation of a real part $y1r$ and an imaginary part $y1i$ of an admittance $y1$ which is the inverse of the impedance of the series assembly of the output impedance of the amplifier and the measurement impedance, a calculation of an equivalent network comprising a Pi configuration of an input reactive impedance, an output reactive impedance, and a link reactive impedance equal to that of the real network, this Pi configuration being placed between two real admittances which are the real parts $y1r$ and $y2r$, and the calculation being a determination of the input and output reactive admittances that are needed in the equivalent network in order to match the impedance of this network loaded by $y2r$ to the real input impedance $y1r$, and finally, after calculation of the input and output reactive admittances of the equivalent network, a determination of admittances of the matching network in the following manner:

the input reactive admittance is the difference between the input admittance of the equivalent network and the imaginary part $y1i$, the output reactive impedance is the difference between the output admittance of the equivalent network and the imaginary part $y2i$, and the link reactive impedance is that of the equivalent network.

11. A radiofrequency transmission or receiver channel comprising:

at least one amplifier;

an antenna;

a calculation processor;

an impedance matching network between the amplifier and the antenna, the impedance matching network comprising several impedances some of which have adjustable numerical values;

a measurement impedance inserted in series between the amplifier and the impedance matching network;

means for measuring a first voltage across the terminals of the measurement impedance and a second voltage at the output of the amplifier (for a transmission channel) or at the input of the amplifier (for a receiver channel), wherein the calculation processor is configured to calculate a current complex load or input impedance of the amplifier based on a ratio between the second voltage and the first voltage, taking into account a phase difference between the first and second voltages;

the calculation processor is further configured to calculate an impedance of the antenna as a function of the current load or input impedance and as a function of known current values of the adjustable impedances of the impedance matching network;

the calculation processor is further configured to calculate new adjustable values of impedance for the impedance matching network which allow an overall load or input impedance of the amplifier to be obtained as close as possible to a nominal load or input impedance of the amplifier, based on the calculated impedance of the antenna;

the channel further comprises electrical means for controlling the impedance matching network for adjusting the adjustable impedances to the new values;

the measurement impedance is a variable complex impedance;

the calculation processor is further configured to select a desired value of the measurement impedance as a function of a desired operating frequency for the channel and of the nominal load or input impedance of the channel; and the channel further comprises means for assigning this selected value to the measurement impedance.

12. The radiofrequency transmission or receiver channel according to claim 11, wherein the measurement impedance is a capacitor.

13. The radiofrequency transmission or receiver channel according to claim 11 or 12, wherein the matching network comprises a T or Pi configuration of three reactive elements.

\* \* \* \* \*

UNITED STATES PATENT AND TRADEMARK OFFICE
CERTIFICATE OF CORRECTION

| | | |
|---|---|---|
| PATENT NO. | : 9,041,611 B2 | Page 1 of 1 |
| APPLICATION NO. | : 13/394769 | |
| DATED | : May 26, 2015 | |
| INVENTOR(S) | : Francis Chan Wai Po et al. | |

It is certified that error appears in the above-identified patent and that said Letters Patent is hereby corrected as shown below:

In the claims:

Please replace "dose" with --close-- in Col. 14, line 49 of claim 1 and in Col. 15, line 17 of claim 2.

Signed and Sealed this
Twenty-second Day of September, 2015

Michelle K. Lee
*Director of the United States Patent and Trademark Office*